United States Patent
Yamano

(10) Patent No.: US 8,349,733 B2
(45) Date of Patent: Jan. 8, 2013

(54) MANUFACTURING METHOD OF SUBSTRATE WITH THROUGH ELECTRODE

(75) Inventor: Takaharu Yamano, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 285 days.

(21) Appl. No.: 12/132,187

(22) Filed: Jun. 3, 2008

(65) Prior Publication Data

US 2008/0299768 A1    Dec. 4, 2008

(30) Foreign Application Priority Data

Jun. 4, 2007    (JP) .................................. 2007-148182

(51) Int. Cl.
  *H01L 21/768* (2006.01)
(52) U.S. Cl. ........ 438/667; 438/666; 257/773; 257/774; 257/786; 257/E21.585; 257/E21.586; 257/E21.597
(58) Field of Classification Search .................. 438/666, 438/667; 257/773, 774, 786, E21.585, E21.586, 257/E21.597
See application file for complete search history.

(56) References Cited

U.S. PATENT DOCUMENTS

| | | | |
|---|---|---|---|
| 5,485,039 A | 1/1996 | Fujita et al. | |
| 6,744,122 B1* | 6/2004 | Hashimoto | 257/668 |
| 7,547,975 B2 | 6/2009 | Takaya et al. | |
| 2003/0107119 A1* | 6/2003 | Kim | 257/686 |
| 2004/0137705 A1 | 7/2004 | Nemoto et al. | |
| 2004/0173890 A1 | 9/2004 | Moriizumi | |
| 2004/0259351 A1 | 12/2004 | Koizumi | |
| 2004/0265482 A1 | 12/2004 | Horikawa et al. | |
| 2005/0161804 A1 | 7/2005 | Iijima et al. | |
| 2006/0001173 A1* | 1/2006 | Yamano et al. | 257/774 |
| 2006/0073701 A1* | 4/2006 | Koizumi et al. | 438/666 |
| 2006/0096781 A1* | 5/2006 | Yamano | 174/264 |
| 2008/0164573 A1* | 7/2008 | Basker et al. | 257/621 |
| 2009/0008747 A1* | 1/2009 | Hoshino et al. | 257/621 |

FOREIGN PATENT DOCUMENTS

| | | | |
|---|---|---|---|
| EP | 1612859 A2 * | 1/2006 | |
| EP | 1 643 819 | 4/2006 | |
| EP | 1746652 | 1/2007 | |
| JP | 5-183019 A | 7/1993 | |
| JP | 05183019 A * | 7/1993 | |
| JP | 2002-314244 | 10/2002 | |
| JP | 2002-314244 A | 10/2002 | |
| JP | 2004-221240 | 8/2004 | |
| JP | 2005-64470 A | 3/2005 | |
| JP | 2005-072061 | 3/2005 | |
| JP | 2005-072064 | 3/2005 | |
| JP | 2006-108236 A | 4/2006 | |
| JP | 2006-147873 A | 6/2006 | |
| JP | 2006-165112 A | 6/2006 | |

* cited by examiner

*Primary Examiner* — Matthew Reames
*Assistant Examiner* — Ermias Woldegeorgis
(74) *Attorney, Agent, or Firm* — Rankin, Hill & Clark LLP

(57) ABSTRACT

A manufacturing method of a substrate with through electrodes, comprising a substrate having through holes, and through electrodes received in the through holes, includes a through electrode formation step of forming the through electrodes on a support plate, a substrate formation step of forming the substrate, a through electrode reception step of stacking the substrate on the support plate 45 and receiving the through electrodes in the through holes, a resin filling step of filling gaps between side surfaces of the through electrodes and inner walls of the through holes of the substrate 11 with a resin, and a support plate removal step of removing the support plate after the resin filling step.

17 Claims, 17 Drawing Sheets

MANUFACTURING METHOD OF SUBSTRATE WITH THROUGH ELECTRODE

This application claims priority to Japanese Patent Application No. 2007-148182, filed Jun. 4, 2007, in the Japanese Patent Office. The Japanese Patent Application No. 2007-148182 is incorporated by reference in its entirety.

TECHNICAL FIELD

The present disclosure relates to a manufacturing method of a substrate with a through electrode, and particularly to a manufacturing method of a substrate with a through electrode comprising a through electrode extending through a substrate.

RELATED ART

A substrate 200 with through electrodes as shown in FIG. 1 has been used as an interposer for electrically connecting a semiconductor chip to a mounting substrate such as a motherboard.

FIG. 1 is a sectional diagram of a related-art substrate with through electrodes.

Referring to FIG. 1, the related-art substrate 200 with the through electrodes has a substrate 201, an insulating film 202 and through electrodes 203. The substrate 201 is formed in a plate shape, and through holes 205 are formed in the substrate 201. As the substrate 201, for example, a silicon substrate can be used. The insulating film 202 is disposed so as to cover an upper surface 201A of the substrate 201 and a surface of the substrate 201 of the portion exposed to the through holes 205. As the insulating film 202, for example, an oxide film formed by a CVD method can be used.

The through electrode 203 is disposed in the through hole 205 on which the insulating film 202 is formed. The through electrode 203 has a seed layer 207 and a Cu plated film 208. The seed layer 207 is disposed so as to cover the insulating film 202 formed on the through hole 205. The seed layer 207 is a power feeding layer for forming the Cu plated film 208 by an electrolytic plating method. As the seed layer 207, for example, a Cu layer formed by a metal CVD method can be used. The Cu plated film 208 is disposed so as to fill the through hole 205 on which the insulating film 202 and the seed layer 207 are formed.

One end of the through electrode 203 constructed as described above is connected to a semiconductor chip (not shown) and the other end is connected to a mounting substrate (not shown) such as a motherboard.

FIGS. 2 to 12 are diagrams showing manufacturing steps of the related-art substrate with the through electrodes. In FIGS. 2 to 12, the same numerals are assigned to the same components as those of the related-art substrate 200 with the through electrodes.

First, in a step shown in FIG. 2, a substrate 211 used as a base material of the substrate 201 described previously is prepared. As the substrate 211, a substrate with a thickness thicker than that of the substrate 201 is used. As the substrate 211, for example, a silicon substrate can be used.

Next, in a step shown in FIG. 3, a resist film 212 having opening parts 212A is formed on an upper surface 211A of the substrate 211. The opening part 212A is formed so as to expose the upper surface 211A of the substrate 211 of the portion corresponding to a formation region of the through hole 205.

Then, in a step shown in FIG. 4, opening parts 214 are formed in the substrate 211 by anisotropic etching using the resist film 212 as a mask. The opening part 214 results in a through hole 205 by polishing the substrate 211 in a step shown in FIG. 11 described below. Therefore, the opening part 214 is formed so that the depth becomes deeper than a depth of the through hole 205. Then, in a step shown in FIG. 5, the resist film 212 shown in FIG. 4 is removed.

Then, in a step shown in FIG. 6, an insulating film 202 is formed so as to cover the upper surface 211A of the substrate 211 and a surface of the substrate 211 of the portion in which the opening parts 214 are formed by a CVD method. As the insulating film 202, for example, an oxide film can be used.

Then, in a step shown in FIG. 7, a seed layer 207 is formed so as to cover the insulating film 202 by a metal CVD method. As the seed layer 207, for example, a Cu layer can be used.

Then, in a step shown in FIG. 8, a Cu plated film 208 is formed on the seed layer 207 by an electrolytic plating method using the seed layer 207 as a power feeding layer. The Cu plated film 208 is formed so as to fill the opening parts 214 on which the insulating film 202 and the seed layer 207 are formed. At this time, the Cu plated film 208 grows in a direction from the seed layer 207 formed on side surfaces of the opening parts 214 toward the centers of the opening parts 214.

Then, in a step shown in FIG. 9, the extra Cu plated film 208 is polished by a CMP apparatus. This polishing is performed until the insulating film 202 formed on the upper surface 211A of the substrate 211 is exposed. Then, in a step shown in FIG. 10, a support plate 217 is stuck on the upper surface side of a structural body shown in FIG. 9 by an adhesive 216.

Then, in a step shown in FIG. 11, the substrate 211, the insulating film 202, the seed layer 207 and the Cu plated film 208 are polished from the side of a lower surface 211B of the substrate 211 shown in FIG. 10 using a back polishing apparatus, and a substrate 201 having through holes 205 and through electrodes 203 formed in the through holes 205 through the insulating film 202 are formed. Consequently, a structural body corresponding to a substrate 200 with through electrodes is formed under the support plate 217.

Then, in a step shown in FIG. 12, the support plate 217 and the adhesive 216 shown in FIG. 11 are removed. Consequently, the substrate 200 with the through electrodes is manufactured (for example, see Patent Reference 1).

[Patent Reference 1] Japanese Patent Application Publication No. 2004-221240

However, in the related-art substrate 200 with the through electrodes, the CMP apparatus with high processing cost is used, so that there was a problem that a manufacturing cost of the substrate 200 with the through electrodes increases.

Also, in the related-art substrate 200 with the through electrodes, different materials (concretely, the substrate 211, the insulating film 202, the seed layer 207 and the Cu plated film 208) are polished using the back polishing apparatus, so that there was a problem that a crack occurs in the through electrode 203 and the through electrode 203 breaks.

Further, in the related-art substrate 200 with the through electrodes, the Cu plated film 208 which is one of the components of the through electrode 203 is grown in the direction from the seed layer 207 formed on the side surfaces of the opening parts 214 toward the centers of the opening parts 214, so that there was a problem that a void tends to occur in the center of the through electrode 203.

SUMMARY

Exemplary embodiments of the present invention provide a manufacturing method of a substrate with a through electrode capable of preventing breakage of the through electrode and reducing a manufacturing cost of the substrate with the through electrode and also preventing occurrence of a void in the through electrode.

According to one standpoint of the invention, there is provided a manufacturing method of a substrate with a through electrode, characterized by including a through electrode formation step of forming a through electrode on a support plate, a substrate formation step of forming a substrate having a through hole, a through electrode reception step of stacking the substrate on the support plate and receiving the through electrode in the through hole, a resin filling step of filling a gap between a side surface of the through electrode and an inner wall of the through hole of the substrate with a resin, and a support plate removal step of removing the support plate after the resin filling step.

According to the invention, by forming a through electrode on a support plate and thereafter stacking a substrate on the support plate and receiving the through electrode in a through hole and then filling a gap between a side surface of the through electrode and an inner wall of the through hole of the substrate with a resin and thereafter removing the support plate, a substrate with a through electrode is manufactured. Therefore, the need for polishing using a CMP apparatus with high processing cost or a back polishing apparatus required in related art is eliminated, so that breakage of the through electrode can be prevented and also a manufacturing cost of the substrate with the through electrode can be reduced.

Also, in the through electrode formation step, it may be constructed so that a resist film having an opening part is formed on the support plate and thereafter, a plated film is precipitated from the top of the support plate exposed to a bottom part of the opening part toward the opening end of the opening part by electrolytic plating and the through electrode is formed and after the through electrode is formed, the resist film is removed. By precipitating the plated film from the top of the support plate exposed to the bottom part of the opening part toward the opening end of the opening part thus, a void can be prevented from occurring in the through electrode.

According to the invention, breakage of a through electrode can be prevented and a manufacturing cost of a substrate with the through electrode can be reduced and also occurrence of a void in the through electrode can be prevented.

Other features and advantages may be apparent from the following detailed description, the accompanying drawings and the claims.

DETAILED DESCRIPTION

Next, embodiments of the invention will be described based on the drawings.

First Embodiment

Figure 13:
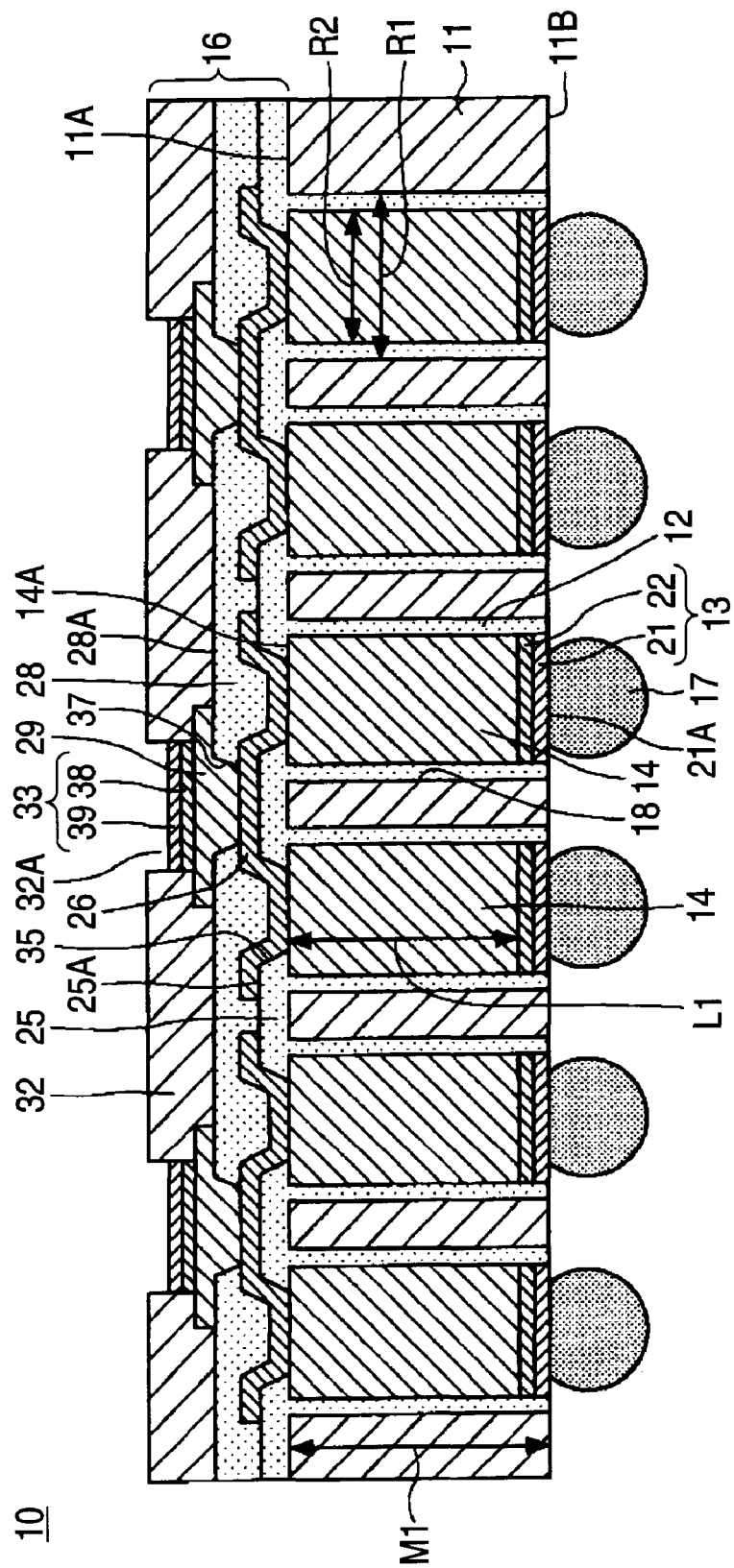
FIG. 13 is a sectional diagram of a substrate with through electrodes according to a first embodiment of the invention.

FIG. 13 is a sectional diagram of a substrate with through electrodes according to a first embodiment of the invention.

Referring to FIG. 13, a substrate 10 with through electrodes of the present embodiment has a substrate 11, a resin 12, a diffusion preventive film 13, through electrodes 14, a build-up structural body 16 which is a wiring layer, and external connection terminals 17.

The substrate 11 is formed in a plate shape, and has plural through holes 18. A diameter R1 of the through hole 18 can be set at a value larger than a diameter R2 of the through electrode 14 by, for example, 20 μm or more. As the substrate 11, for example, a silicon substrate or a quartz glass substrate can be used. A thickness M1 of the substrate 11 is set so as to become substantially equal to a value in which a length L1 of the through electrode 14 and a thickness of the diffusion preventive film 13 are added. In the embodiment, the following description will be made by taking the case of using a silicon substrate as the substrate 11 as an example.

The resin 12 is disposed so as to fill a gap formed between side surfaces of the through electrodes 14 and the diffusion preventive film 13 and the substrate 11 (in other words, inner walls of the through holes 18) of the portion opposed to the side surfaces of the through electrodes 14 and the diffusion preventive film 13. The resin 12 is means for insulating the substrate 11 from the diffusion preventive film 13 and the through electrodes 14. As the resin 12, for example, an epoxy resin can be used.

The diffusion preventive film 13 is configured to have an Au layer 21 and a Ni layer 22 laminated on the Au layer 21. The diffusion preventive film 13 is disposed in the plural through holes 18 so that a lower surface of the Au layer 21 is substantially flush with a lower surface 11B of the substrate 11. A thickness of the Au layer 21 can be set at, for example, 0.1 μm. Also, a thickness of the Ni layer 22 can be set at, for example, 2 μm. The diffusion preventive film 13 is a film for preventing Cu included in the through electrode 14 from diffusing into the external connection terminal 17.

The through electrode 14 is disposed in the through hole 18 through the resin 12. The lower end of the through electrode 14 is in contact with the Ni layer 22. Consequently, the through electrode 14 is electrically connected to the diffusion preventive film 13. An upper surface 14A of the through electrode 14 is made substantially flush with an upper surface 11A of the substrate 11. The diameter R2 of the through electrode 14 can be set at, for example, 20 μm to 150 μm. Also, the length L1 of the through electrode 14 can be set at, for example, 50 μm to 300 μm. As a material of the through electrode 14, for example, Cu can be used.

The build-up structural body 16 has resin layers 25, 28, wiring patterns 26, 29, a solder resist 32, and a diffusion preventive film 33.

The resin layer 25 is disposed so as to cover a part of the upper surface 14A of the through electrode 14, an upper surface of the resin 12 and the upper surface 11A of the substrate 11. The resin layer 25 has an opening part 35 for exposing a part of the upper surface 14A of the through electrode 14. As a material of the resin layer 25, for example, an epoxy resin can be used.

The wiring pattern 26 is disposed on an upper surface 25A of the resin layer 25 and the opening part 35 so as to electrically connect the two adjacent through electrodes 14 as one example. As a material of the wiring pattern 26, for example, Cu can be used.

The resin layer 28 is disposed so as to cover a part of the wiring pattern 26 and an upper surface 25A of the resin layer 25. The resin layer 28 has an opening part 37 for exposing an upper surface of the wiring pattern 26 of the portion arranged on the upper surface 25A of the resin layer 25. As a material of the resin layer 28, for example, an epoxy resin can be used.

The wiring pattern 29 is disposed so as to extend from the opening part 37 to an upper surface 28A of the resin layer 28 while filling the opening part 37. The wiring pattern 29 is electrically connected to the wiring pattern 26. As a material of the wiring pattern 29, for example, Cu can be used. The wiring pattern 29 has a diffusion preventive film formation region in which the diffusion preventive film 33 is formed.

The solder resist 32 is disposed so as to cover the upper surface 28A of the resin layer 28 and a part of the wiring pattern 29. The solder resist 32 has an opening part 32A for exposing the diffusion preventive film formation region of the wiring pattern 29.

The diffusion preventive film 33 is disposed on the wiring pattern 29 of the portion exposed to the opening part 32A. The diffusion preventive film 33 is configured to sequentially laminate a Ni layer 38 and an Au layer 39 on the wiring pattern 29. A thickness of the Ni layer 38 can be set at, for example, 2 μm. Also, a thickness of the Au layer 39 can be set at, for example, 0.1 μm. An electronic component (for example, a semiconductor chip) is mounted on the diffusion preventive film 33. The diffusion preventive film 33 is a pad for installing the electronic component.

By disposing the build-up structural body 16 constructed as described above, a range of selection of an electronic component installation position can be widened by adjusting routing of the wiring pattern 29 and disposing the diffusion preventive film 33 in any position.

The external connection terminal 17 is disposed on the side of a lower surface 21A of the Au layer 21. The external connection terminal 17 is electrically connected to the through electrode 14 through the diffusion preventive film 13. The external connection terminal 17 is a terminal connected to a mounting substrate (not shown) such as a motherboard. As the external connection terminal 17, for example, a solder bump can be used.

FIGS. 14 to 29 are diagrams showing manufacturing steps of the substrate with the through electrodes according to the first embodiment of the invention. In FIGS. 14 to 29, the same numerals are assigned to the same components as those of the substrate 10 with the through electrodes of the first embodiment.

Figure 14:
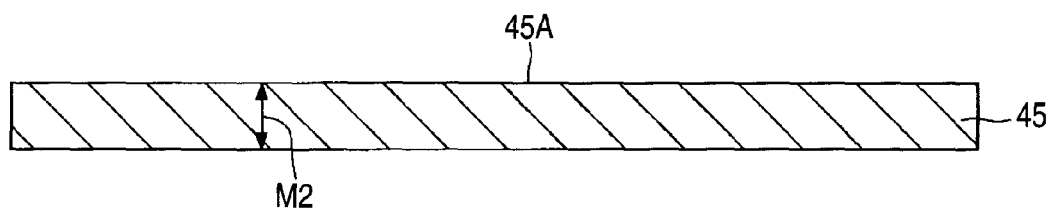
FIG. 14 is a diagram showing a manufacturing step of the substrate with the through electrodes according to the first embodiment of the invention (first).

First, in a step shown in FIG. 14, a support plate 45 formed in a plate shape is prepared. As the support plate 45, a silicon substrate or a metal plate (for example, a Cu plate) can be used. In the embodiment, the following description will be made by taking the case of using the silicon substrate as the support plate 45 as an example. In the case of using the silicon substrate as the support plate 45, a thickness M2 of the support plate 45 can be set at, for example, 0.4 mm to 0.8 mm.

Figure 15:
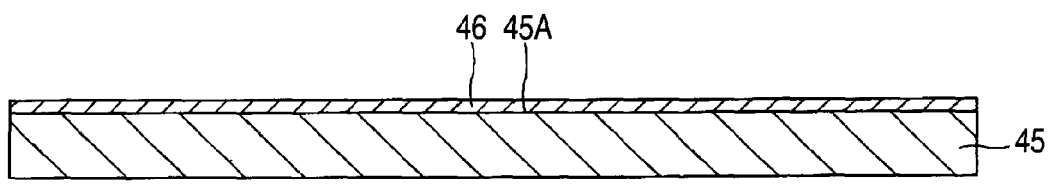
FIG. 15 is a diagram showing a manufacturing step of the substrate with the through electrodes according to the first embodiment of the invention (second).

Next, in a step shown in FIG. 15, a seed layer 46 is formed so as to cover an upper surface 45A of the support plate 45. As the seed layer 46, for example, a Cu layer can be used. When the Cu layer is used as the seed layer 46, the Cu layer can be formed by, for example, a sputtering method. In addition, when the metal plate is used as the support plate 45, the metal plate functions as a seed layer, so that the need for formation of the seed layer 46 is eliminated.

Figure 16:
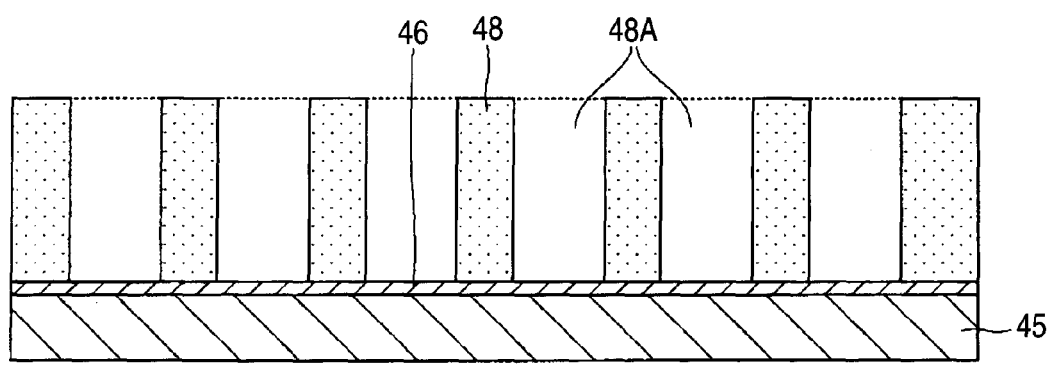
FIG. 16 is a diagram showing a manufacturing step of the substrate with the through electrodes according to the first embodiment of the invention (third).

Then, in a step shown in FIG. 16, a resist film 48 having plural opening parts 48A is formed on the seed layer 46. A diameter of the opening part 48A is formed so as to become substantially equal to the diameter R2 (see FIG. 13) of the through electrode 14 described above. Also, the opening part 48A is formed so as to expose an upper surface of the seed layer 46.

Figure 17:
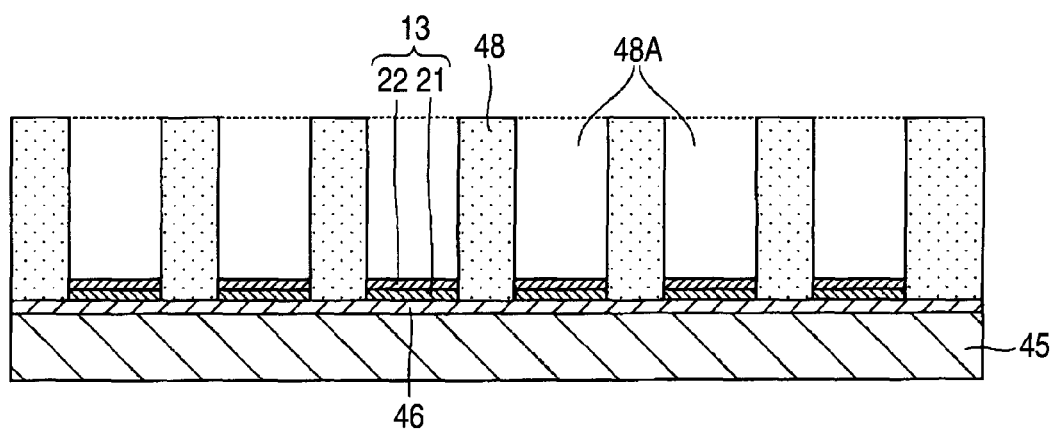
FIG. 17 is a diagram showing a manufacturing step of the substrate with the through electrodes according to the first embodiment of the invention (fourth).

Then, in a step shown in FIG. 17, a diffusion preventive film 13 is formed by sequentially precipitating and growing an Au layer 21 and a Ni layer 22 on the seed layer 46 of the portion exposed to the opening part 48A by an electrolytic plating method using the seed layer 46 as a power feeding layer.

Figure 18:
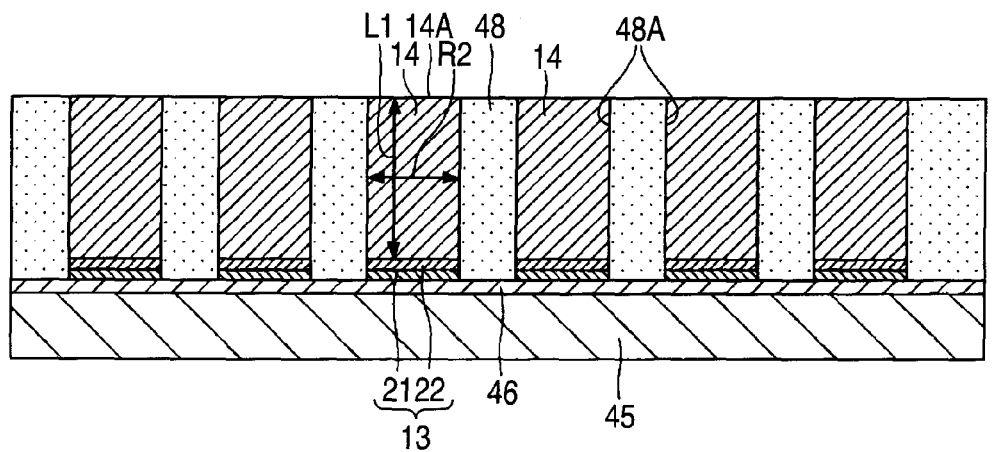
FIG. 18 is a diagram showing a manufacturing step of the substrate with the through electrodes according to the first embodiment of the invention (fifth).

Then, in a step shown in FIG. 18, a through electrode 14 made of a plated film is formed by precipitating and growing the plated film on the Ni layer 22 by an electrolytic plating method using the seed layer 46 as a power feeding layer (a through electrode formation step). At this time, the plated film is precipitated and grown from the top of the Ni layer 22 toward the opening end of the opening part 48A (the upper end of the opening part 48A).

By precipitating and growing the plated film from the top of the Ni layer 22 toward the opening end of the opening part 48A (the upper end of the opening part 48A) by the electrolytic plating method thus, occurrence of a void of the inside of the through electrode 14 can be prevented though it was difficult to prevent the occurrence of the void in the related art.

Figure 1:
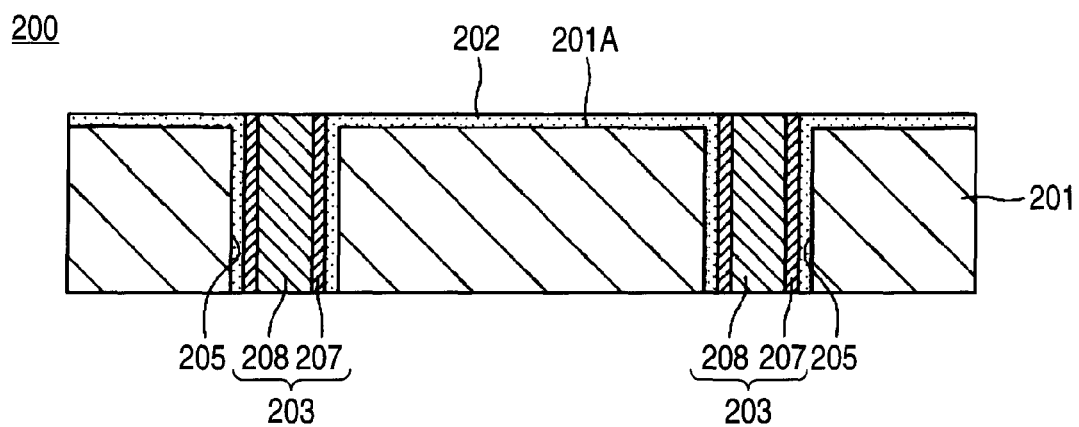
FIG. 1 is a sectional diagram of a related-art substrate with through electrodes.
Figure 2:
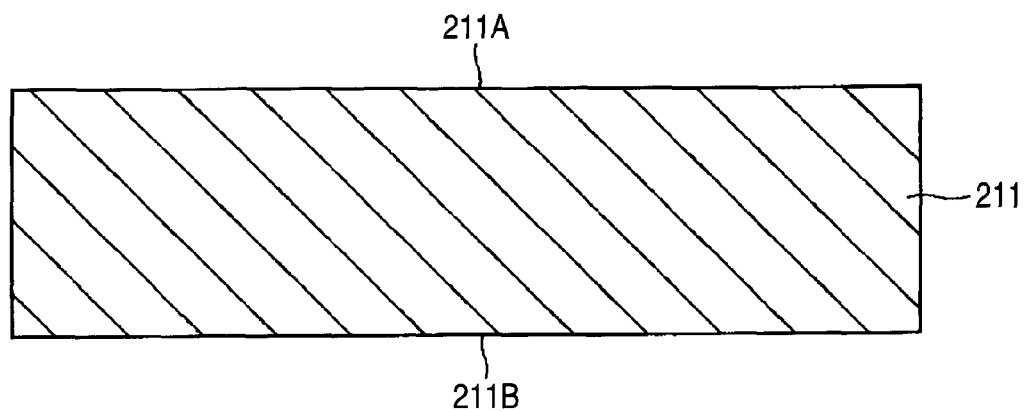
FIG. 2 is a diagram showing a manufacturing step of the related-art substrate with the through electrodes (first).
Figure 3:
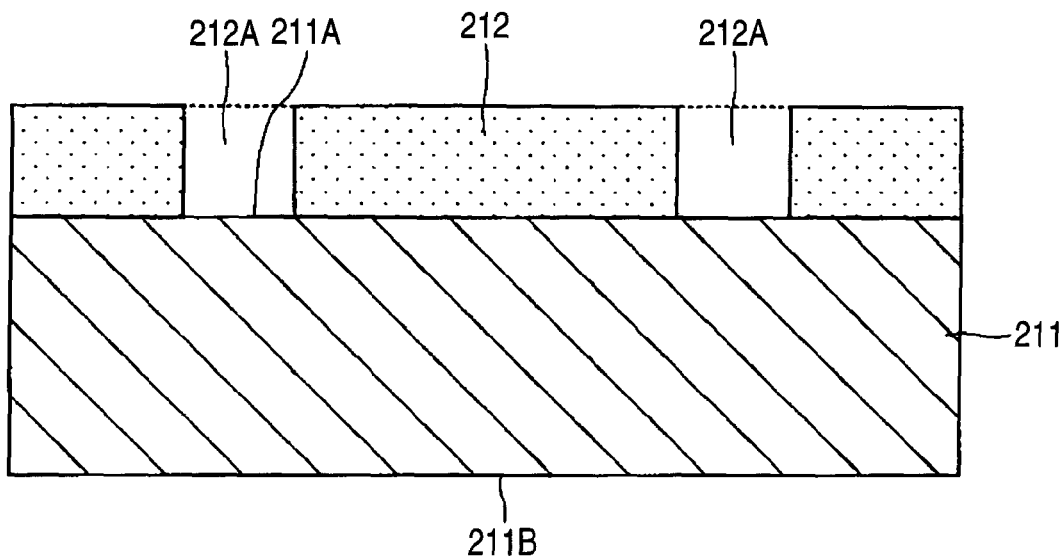
FIG. 3 is a diagram showing a manufacturing step of the related-art substrate with the through electrodes (second).
Figure 4:
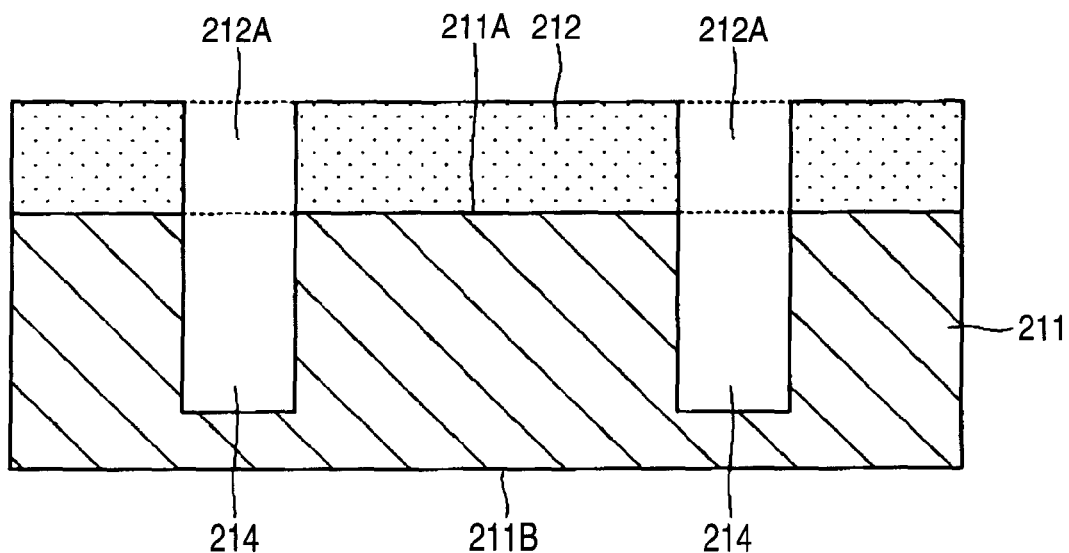
FIG. 4 is a diagram showing a manufacturing step of the related-art substrate with the through electrodes (third).
Figure 5:
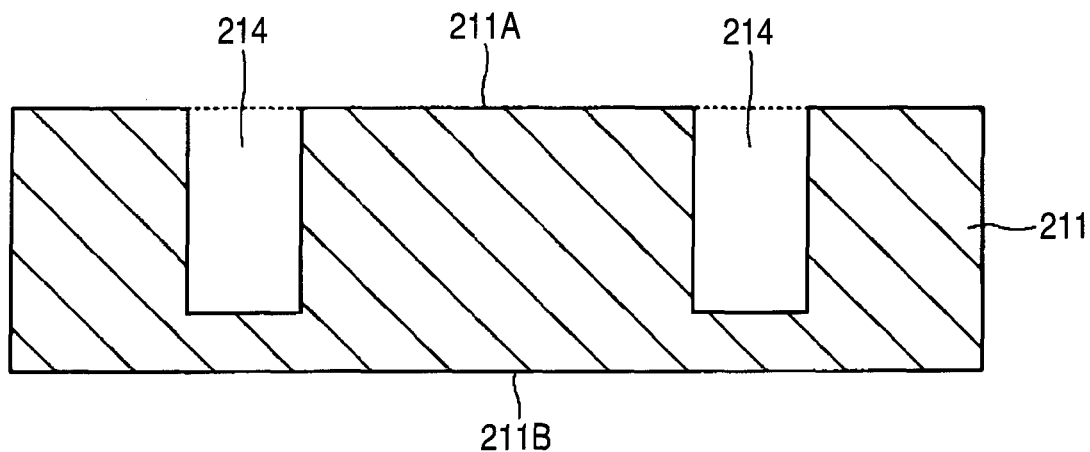
FIG. 5 is a diagram showing a manufacturing step of the related-art substrate with the through electrodes (fourth).
Figure 6:
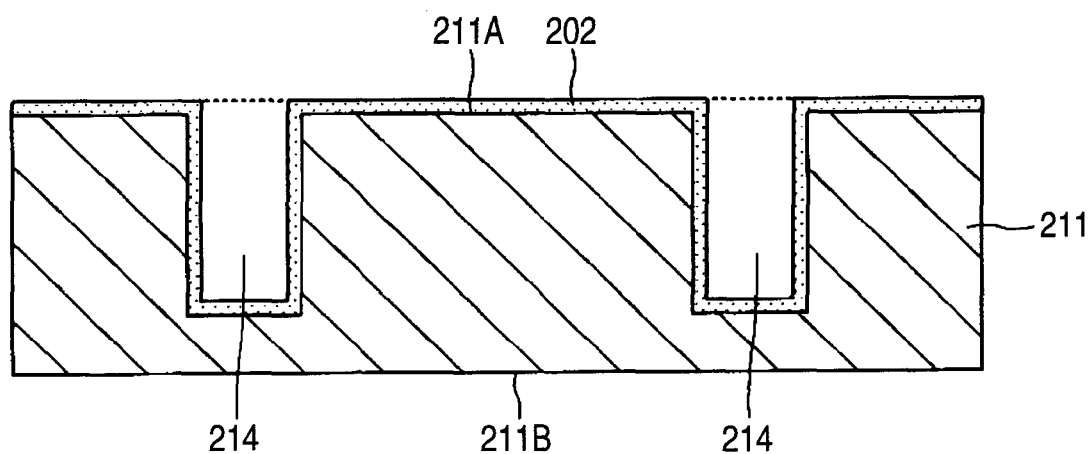
FIG. 6 is a diagram showing a manufacturing step of the related-art substrate with the through electrodes (fifth).
Figure 7:
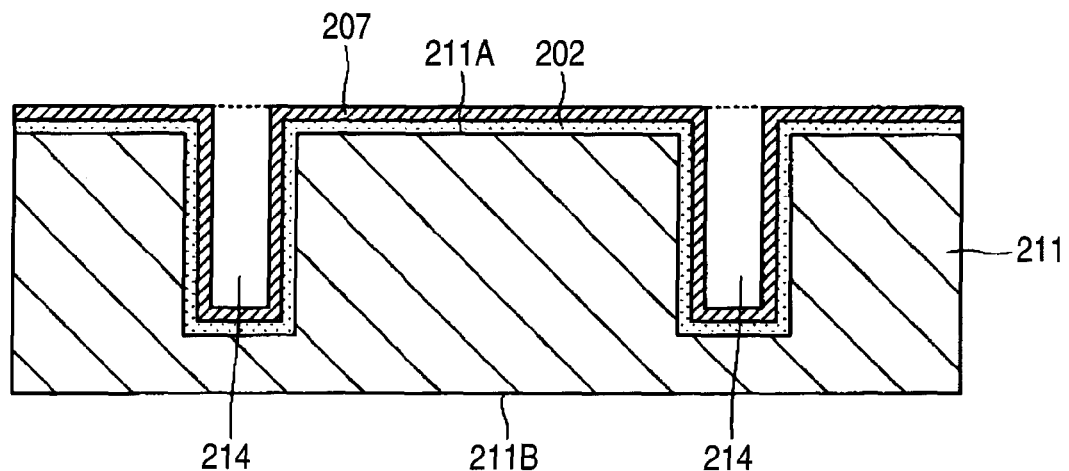
FIG. 7 is a diagram showing a manufacturing step of the related-art substrate with the through electrodes (sixth).
Figure 8:
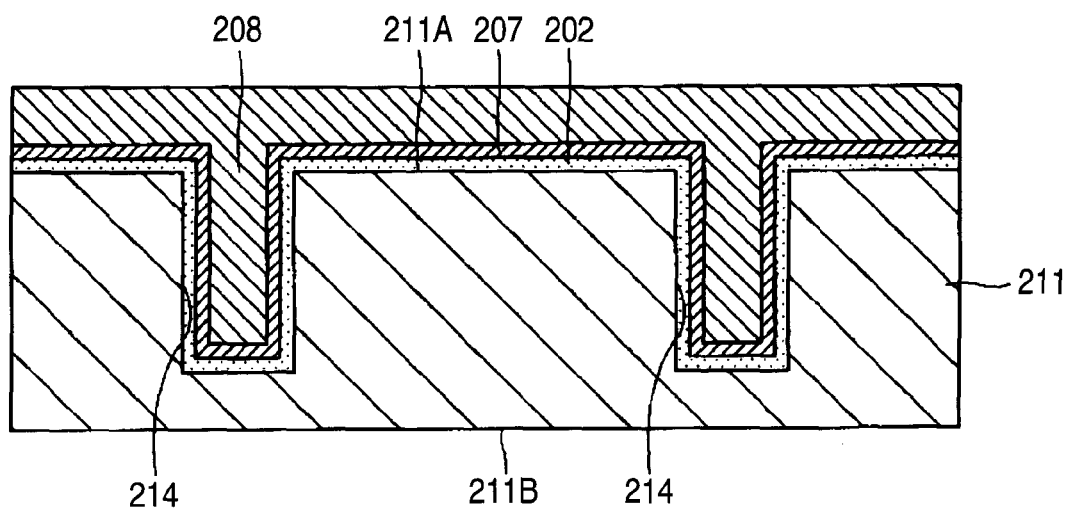
FIG. 8 is a diagram showing a manufacturing step of the related-art substrate with the through electrodes (seventh).
Figure 9:
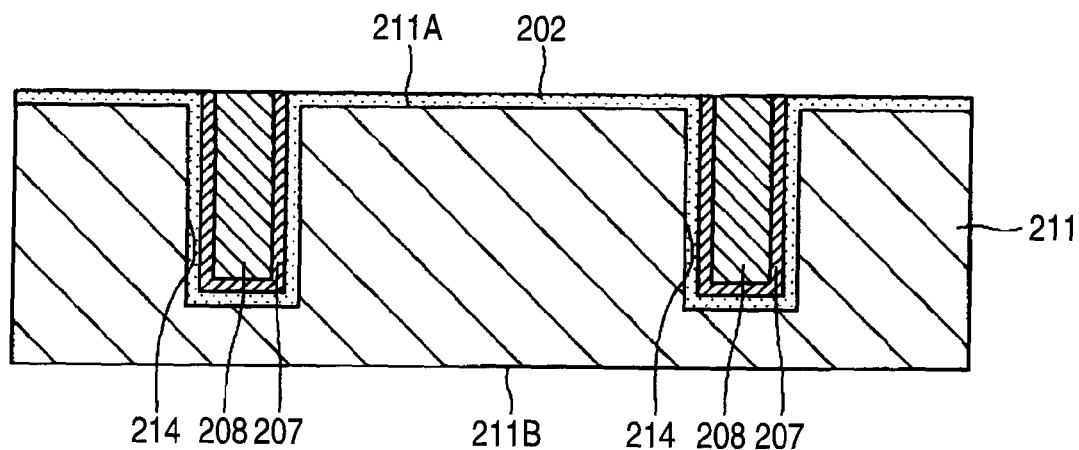
FIG. 9 is a diagram showing a manufacturing step of the related-art substrate with the through electrodes (eighth).
Figure 10:
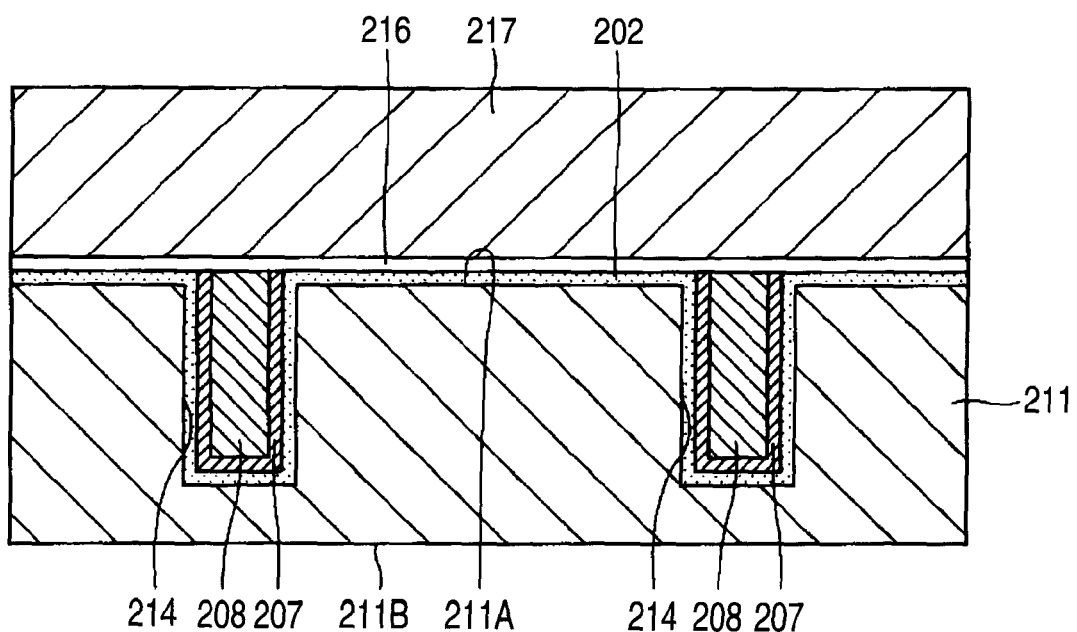
FIG. 10 is a diagram showing a manufacturing step of the related-art substrate with the through electrodes (ninth).
Figure 11:
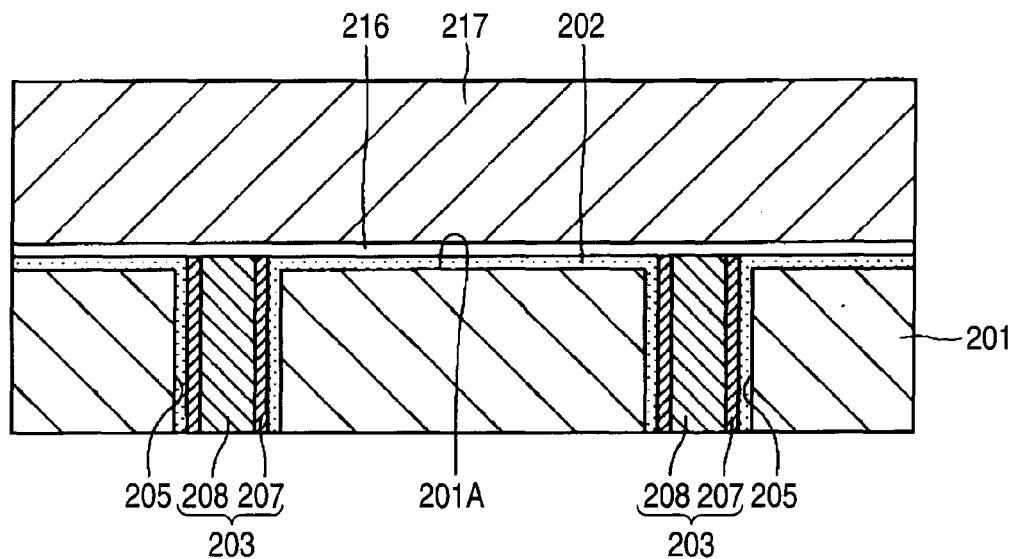
FIG. 11 is a diagram showing a manufacturing step of the related-art substrate with the through electrodes (tenth).
Figure 12:
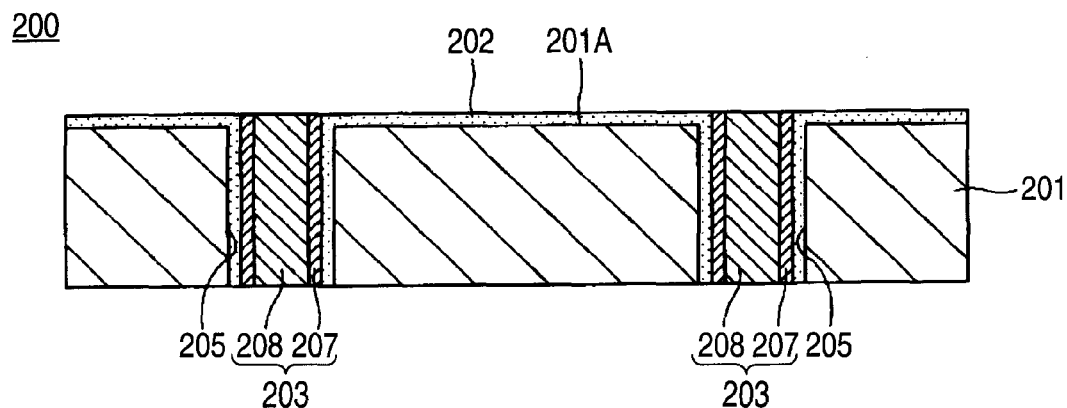
FIG. 12 is a diagram showing a manufacturing step of the related-art substrate with the through electrodes (eleventh).

Also, in the formation method of the through electrode 14, the through electrode 14 can be formed without polishing a base material (the seed layer 207 and the Cu plated film 208) resulting in the through electrode 203 by a CMP apparatus with high processing cost (see FIG. 9) or polishing a base material (the seed layer 207 and the Cu plated film 208) resulting in the through electrode 203 and the substrate 211 by a back polishing apparatus (see FIG. 11) as described in the manufacturing method of the related-art substrate 200 with the through electrodes. Therefore, breakage of the through electrode 14 can be prevented and also a manufacturing cost of the substrate 10 with the through electrodes can be reduced.

The diameter R2 of the through electrode 14 can be set at, for example, 20 μm to 150 μm. Also, the length L1 of the through electrode 14 can be set at, for example, 50 μm to 300 μm.

Figure 19:
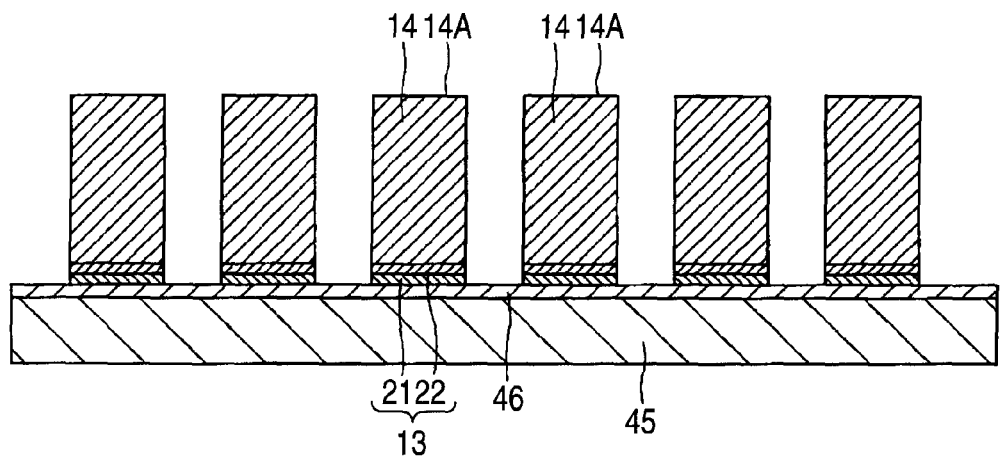
FIG. 19 is a diagram showing a manufacturing step of the substrate with the through electrodes according to the first embodiment of the invention (sixth).

Then, in a step shown in FIG. 19, the resist film 48 shown in FIG. 18 is removed. Consequently, the columnar through electrodes 14 can be obtained. Then, in a step shown in FIG. 20, a substrate 11 having plural through holes 18 is formed (a substrate formation step). The plural through holes 18 can be formed by, for example, an isotropic etching of the substrate 11. The through hole 18 is formed so that its diameter R1 becomes larger than the diameter R2 of the through electrode 14 by, for example, 20 μm or more. As the substrate 11, for example, a silicon substrate or a quartz glass substrate can be used. In the embodiment, the silicon substrate is taken as an example. The thickness M1 of the substrate 11 is set so as to become substantially equal to a value in which the length L1 of the through electrode 14 and the thickness of the diffusion preventive film 13 are added. Consequently, in a step shown in FIG. 21 described below, an upper surface 14A of the through electrode 14 can be made substantially flush with an upper surface 11A of the substrate 11. In addition, the upper surface 14A of the through electrode 14 may be somewhat protruded or recessed from the upper surface 11A of the substrate 11.

Figure 20:
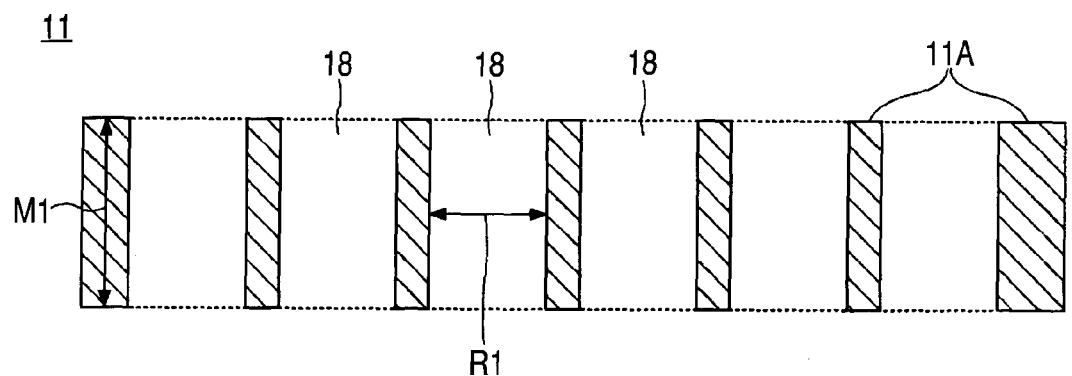
FIG. 20 is a diagram showing a manufacturing step of the substrate with the through electrodes according to the first embodiment of the invention (seventh).
Figure 21:
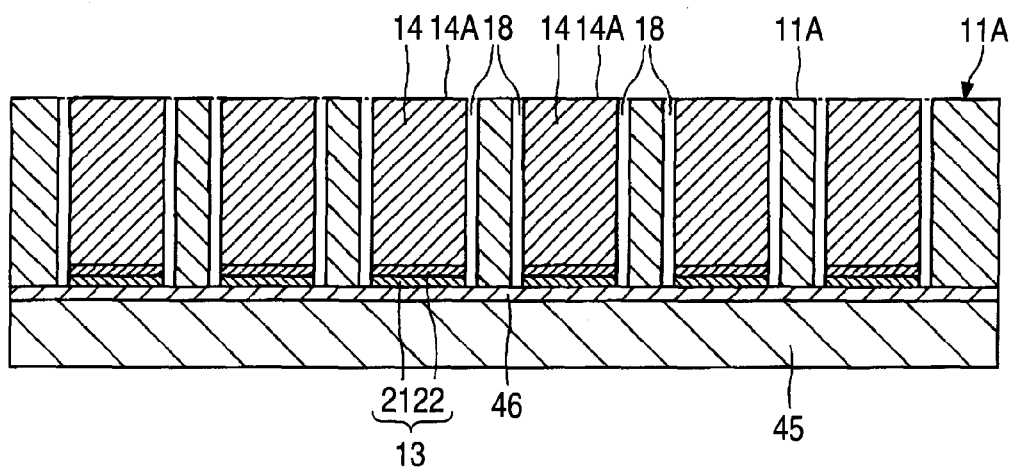
FIG. 21 is a diagram showing a manufacturing step of the substrate with the through electrodes according to the first embodiment of the invention (eighth).

Then, in the step shown in FIG. 21, the substrate 11 shown in FIG. 20 is stacked on a structural body shown in FIG. 19 and the through electrodes 14 are received in the through holes 18 of the substrate 11 so that gaps can be formed between the substrate 11 and the through electrodes 14 (gaps can be formed between inner walls of the through holes 18 and side surfaces of the through electrodes 14) (a through electrode reception step). At this time, the substrate 11 and the structural body shown in FIG. 19 are temporarily fixed by some jig such as a clip so that a relative position of the substrate 11 with respect to the structural body shown in FIG. 19 is not displaced.

Figure 22:
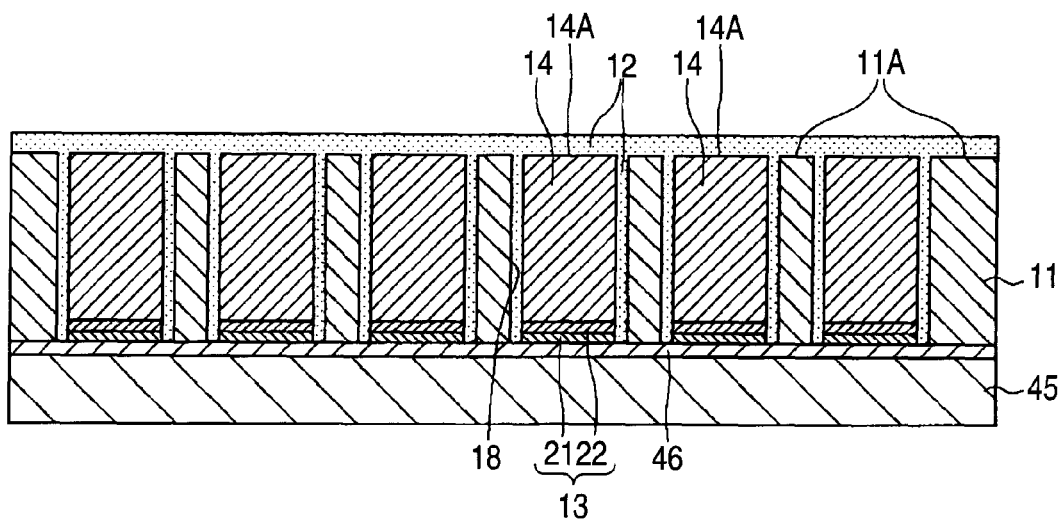
FIG. 22 is a diagram showing a manufacturing step of the substrate with the through electrodes according to the first embodiment of the invention (ninth).

Then, in a step shown in FIG. 22, a resin 12 is formed so as to fill the gaps between the inner walls of the through holes 18 and the side surfaces of the through electrodes 14 and also cover an upper surface of a structural body shown in FIG. 21 (a resin filling step). Concretely, the resin 12 is formed by, for example, softening an epoxy resin after a filmy epoxy resin is stuck so as to cover the upper surface of the structural body shown in FIG. 21. Or, the resin 12 is formed by, for example, applying a liquid epoxy resin by a print method and thereafter curing the epoxy resin.

Also, the resin 12 of the portion for covering the upper surface of the structural body shown in FIG. 21 among the resin 12 formed in the step shown in FIG. 22 results in a base material of a resin layer 25 (see FIG. 13) which is one of the components of the build-up structural body 16 described above by forming opening parts 35 in a step shown in FIG. 23 described below.

By simultaneously forming the base material (the resin 12 of the portion for covering the upper surface of the structural body shown in FIG. 21) of the resin layer 25 which is one of the components of the build-up structural body 16 and the resin 12 with which the gaps formed between the side surfaces of the through electrodes 14 and the substrate 11 of the portion opposed to the side surfaces of the through electrodes 14 are filled thus, the manufacturing steps of the substrate 10 with the through electrodes can be simplified. Also, it serves as a substitute for an oxide film (insulating film) by a related-art CVD method, and cost reduction and simplification of the steps can be achieved.

Figure 23:
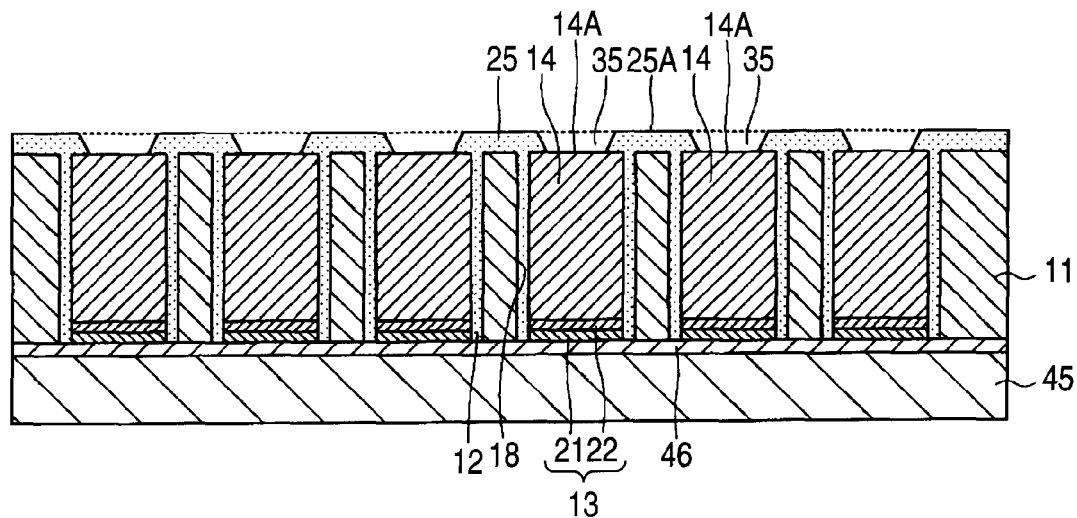
FIG. 23 is a diagram showing a manufacturing step of the substrate with the through electrodes according to the first embodiment of the invention (tenth).

Then, in the step shown in FIG. 23, the opening parts 35 for exposing a part of the upper surfaces 14A of the through electrodes 14 are formed in the resin 12 (see FIG. 22) of the portion for covering the upper surface of the structural body shown in FIG. 21. Consequently, the resin layer 25 having the plural opening parts 35 is formed. The opening parts 35 can be formed by, for example, laser machining.

Figure 24:
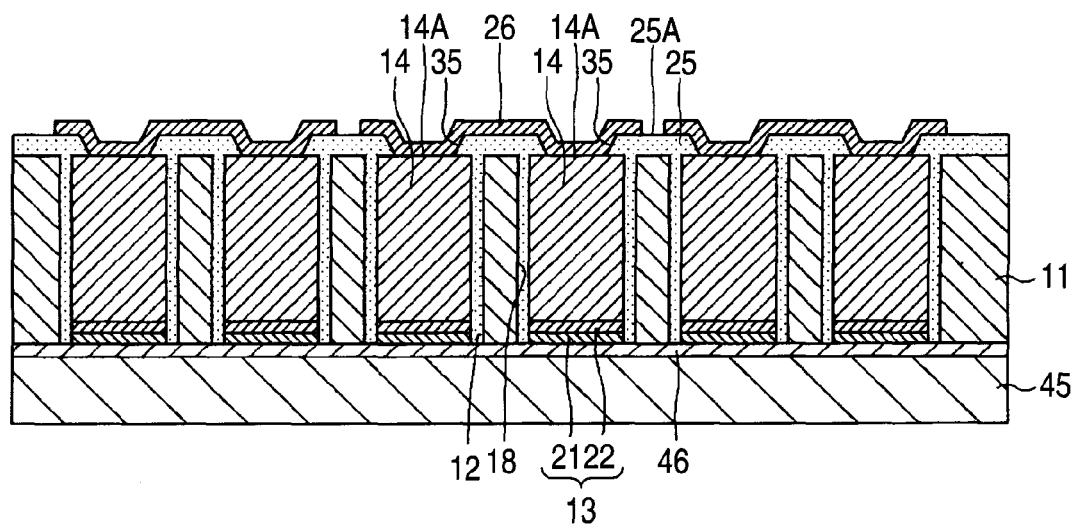
FIG. 24 is a diagram showing a manufacturing step of the substrate with the through electrodes according to the first embodiment of the invention (eleventh).

Then, in a step shown in FIG. 24, a wiring pattern 26 for electrically connecting the two adjacent through electrodes 14 is formed on the upper surface side of a structural body shown in FIG. 23. Concretely, the wiring pattern 26 can be formed by, for example, a semi-additive method. In the case of using the semi-additive method, for example, a Cu plated film can be used as the wiring pattern 26.

Figure 25:
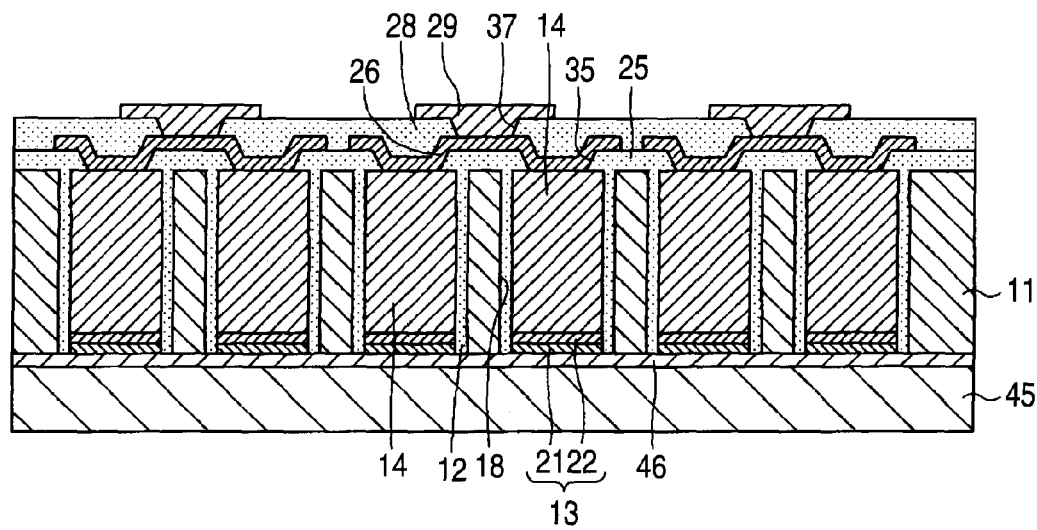
FIG. 25 is a diagram showing a manufacturing step of the substrate with the through electrodes according to the first embodiment of the invention (twelfth).

Then, in a step shown in FIG. 25, a resin layer 28 having opening parts 37 for exposing a part of the wiring pattern 26 and a wiring pattern 29 arranged so as to fill the opening parts 37 and also extend from the opening parts 37 to an upper surface 28A of the resin layer 28 are sequentially formed on a structural body shown in FIG. 24 by a well-known technique such as a semi-additive method. As the resin layer 28, for example, an epoxy resin can be used. Also, as the wiring pattern 29, for example, a Cu plated film can be used.

Figure 26:
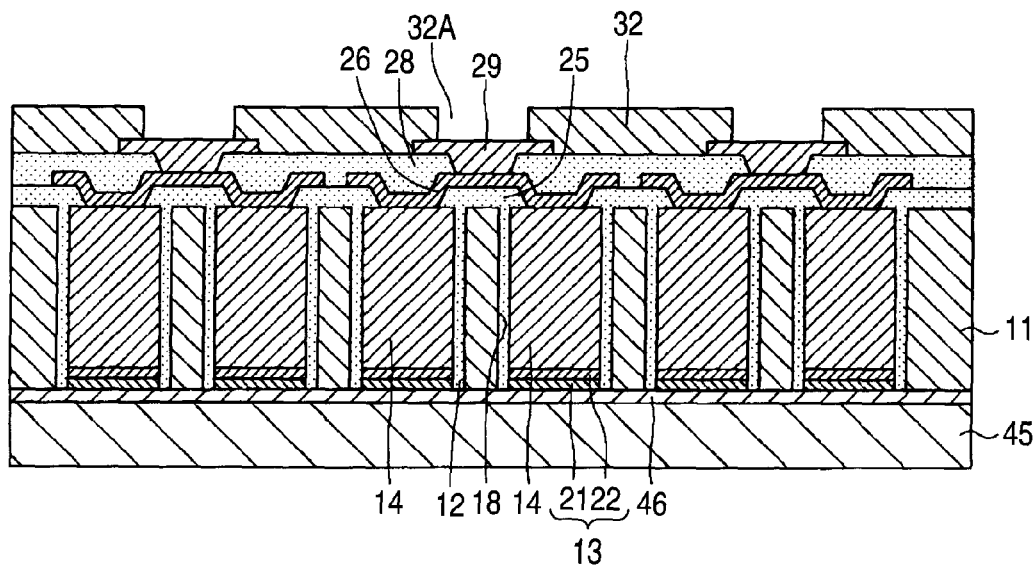
FIG. 26 is a diagram showing a manufacturing step of the substrate with the through electrodes according to the first embodiment of the invention (thirteenth).

Then, in a step shown in FIG. 26, a solder resist 32 having opening parts 32A for exposing a part of an upper surface of the wiring pattern 29 is formed on the resin layer 28.

Figure 27:
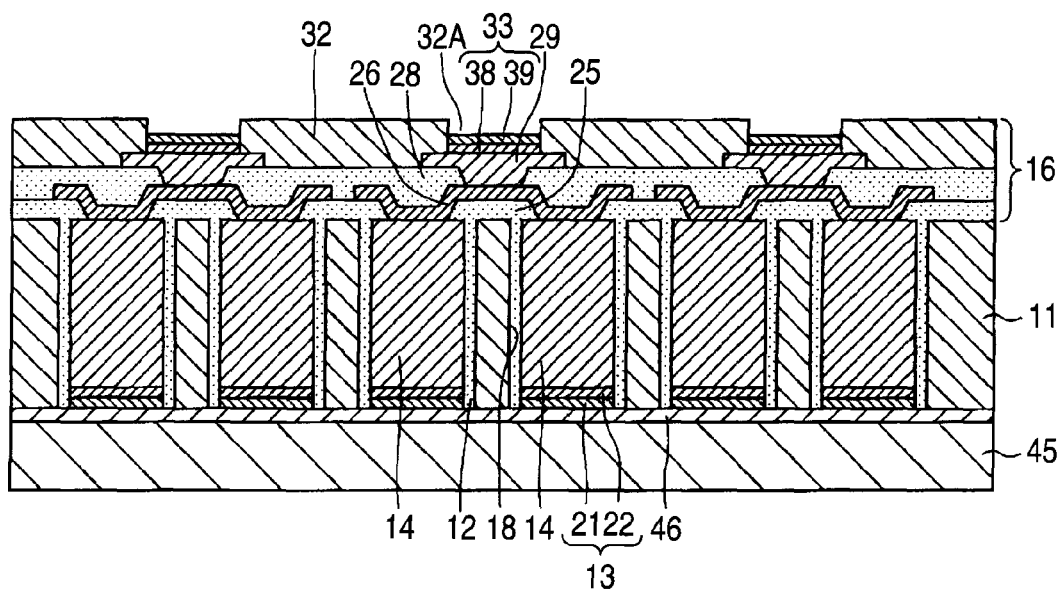
FIG. 27 is a diagram showing a manufacturing step of the substrate with the through electrodes according to the first embodiment of the invention (fourteenth).

Then, in a step shown in FIG. 27, a diffusion preventive film 33 is formed by sequentially precipitating and growing a Ni layer 38 and an Au layer 39 on the wiring pattern 29 of the portion exposed to the opening part 32A by an electrolytic plating method using the seed layer 46 as a power feeding layer. Consequently, the build-up structural body 16 is formed. The steps shown in FIGS. 22 to 27 are a step corresponding to a build-up structural body formation step.

By forming the build-up structural body 16 on the substrate 11 in which the through electrodes 14 are formed thus, a range of selection of an electronic component installation position can be widened by adjusting routing of the wiring pattern 29 and disposing the diffusion preventive film 33 in any position. In addition, the Ni layer 38 and the Au layer 39 may be formed using an electroless plating method.

Figure 28:
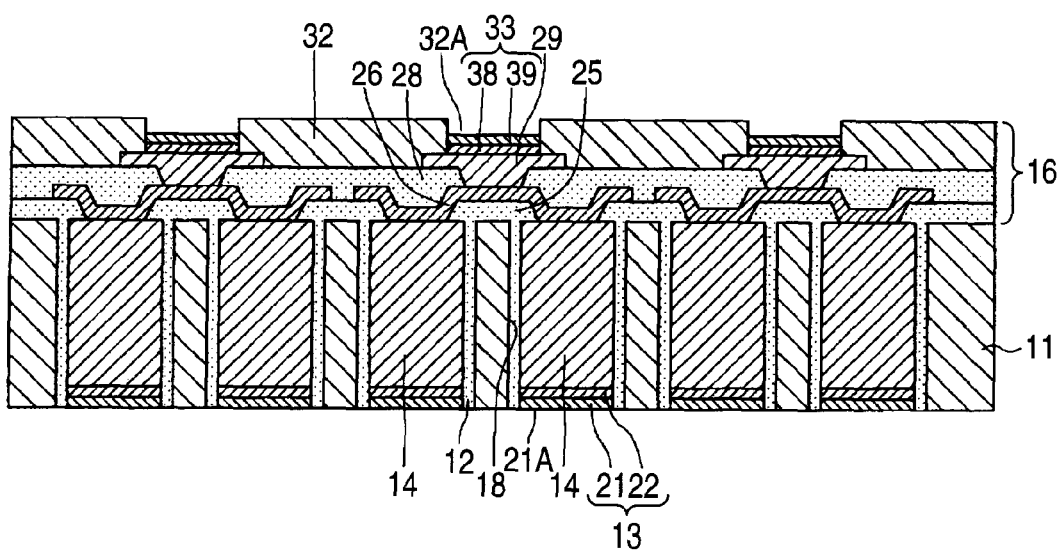
FIG. 28 is a diagram showing a manufacturing step of the substrate with the through electrodes according to the first embodiment of the invention (fifteenth).

Then, in a step shown in FIG. 28, the support plate 45 and the seed layer 46 are sequentially removed. Concretely, for example, the support plate 45 and the seed layer 46 are removed by etching.

Figure 29:
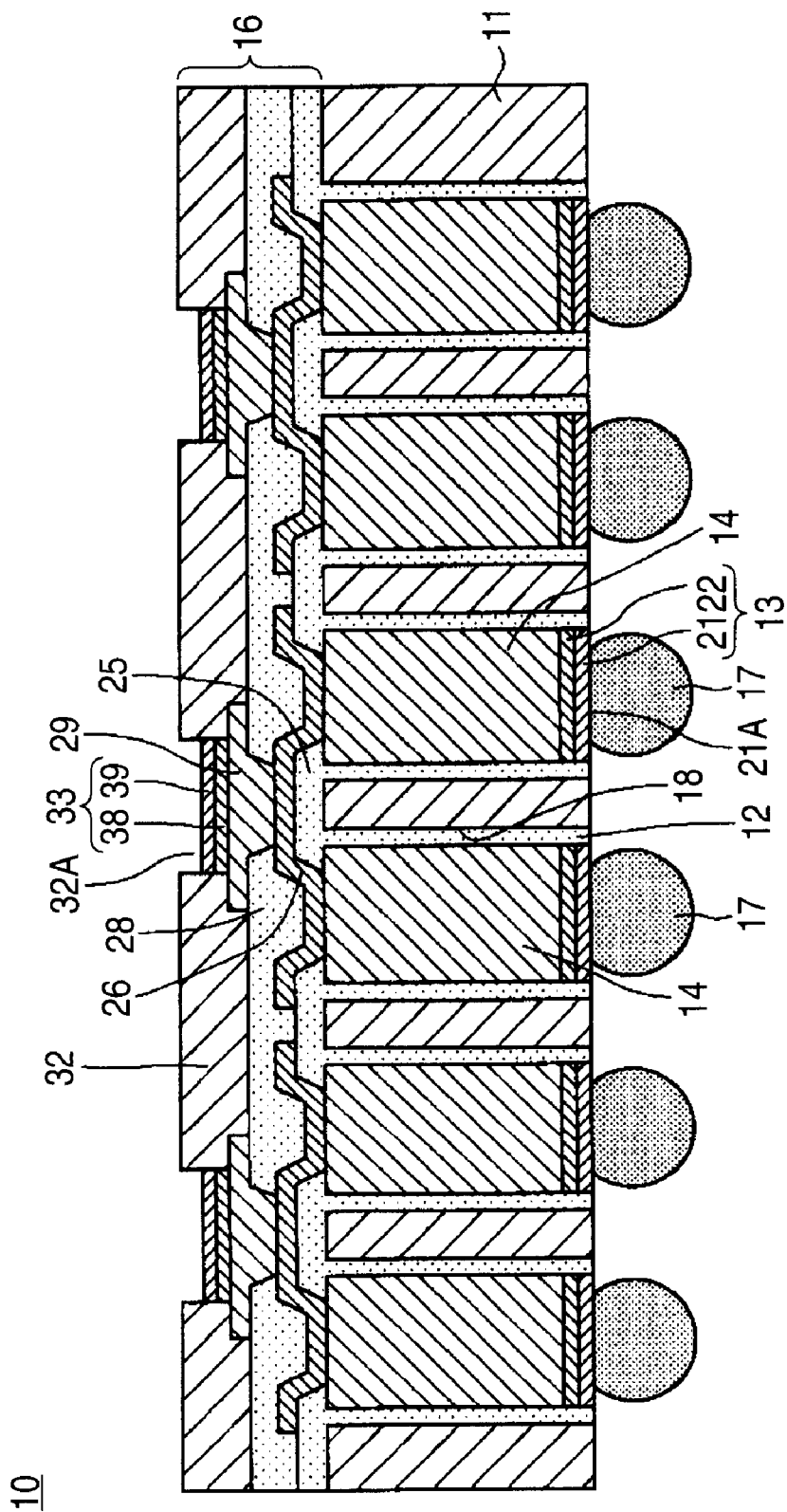
FIG. 29 is a diagram showing a manufacturing step of the substrate with the through electrodes according to the first embodiment of the invention (sixteenth).

Then, in a step shown in FIG. 29, external connection terminals 17 are formed on the sides of lower surfaces 21A of the Au layers 21. Consequently, the substrate 10 with the through electrodes is manufactured. As the external connection terminal 17, for example, a solder bump can be used.

According to the manufacturing method of the substrate with the through electrodes of the embodiment, by forming the through electrodes 14 on the support plate 45 and stacking the substrate 11 in which the through holes 18 are formed on the support plate 45 and receiving the through electrodes 14 in the through holes 18 and then filling the gaps formed between the side surfaces of the through electrodes 14 and the substrate 11 of the portion opposed to the side surfaces of the through electrodes 14 with the resin, the through electrodes 14 can be formed without polishing a base material (the seed layer 207 and the Cu plated film 208) resulting in the through electrode 203 by a CMP apparatus (see FIG. 9) or polishing a base material (the seed layer 207 and the Cu plated film 208) resulting in the through electrode 203 and the substrate 211 by a back polishing apparatus (see FIG. 11) as described in the manufacturing method of the related-art substrate 200 with the through electrodes. Therefore, breakage of the through electrode 14 can be prevented and also a manufacturing cost of the substrate 10 with the through electrodes can be reduced.

Also, the through electrodes 14 are formed by the semi-additive method, so that a void can be prevented from occurring in the through electrode 14.

The preferred embodiment of the invention has been described above in detail, but the invention is not limited to such a specific embodiment, and various modifications and changes can be made within the gist of the invention described in the claims.

For example, an element (for example, a passive element, an active element or a semiconductor circuit) electrically connected to the through electrodes 14 may be disposed on the substrate 11 and also in the substrate with the through electrodes constructed thus, an effect similar to that of the manufacturing method of the substrate 10 with the through electrodes of the embodiment can be obtained.

In addition, using a support plate resulting in a part of the component of plural substrates 10 with through electrodes in which plural through electrodes 14 are formed and a substrate resulting in a part of the component of the plural substrates 10 with the through electrodes in which plural through holes 18 are formed, the manufacturing steps described above are performed and thereafter the support plate and the substrate are cut and thereby, the plural substrates 10 with the through electrodes may be manufactured.

Second Embodiment

Figure 30:
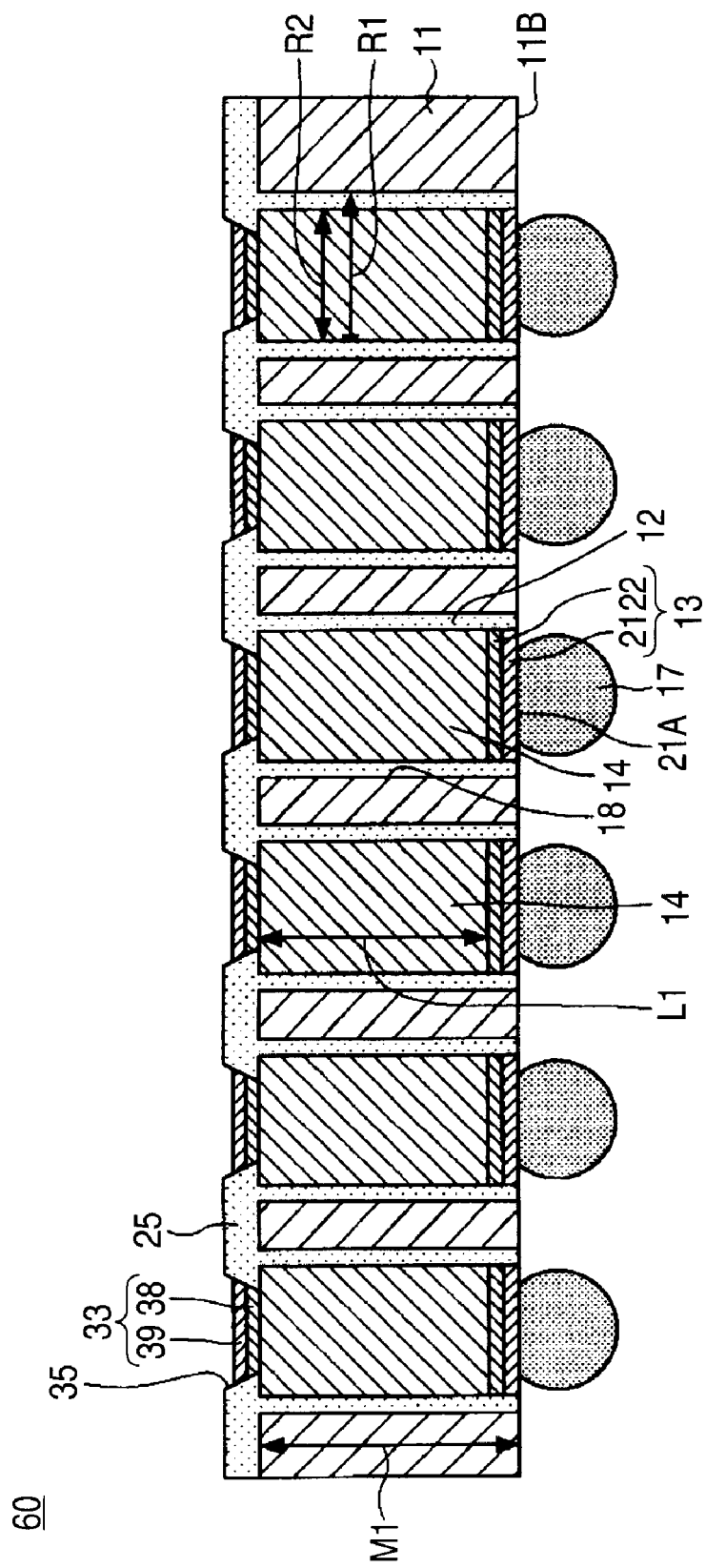
FIG. 30 is a sectional diagram of a substrate with through electrodes according to a second embodiment of the invention.

FIG. 30 is a sectional diagram of a substrate with through electrodes according to a second embodiment of the invention. In FIG. 30, the same numerals are assigned to the same components as those of the substrate 10 with the through electrodes of the first embodiment.

Referring to FIG. 30, a substrate 60 with through electrodes of the second embodiment is constructed in a manner similar to the substrate 10 with the through electrodes except that a diffusion preventive film 33 is disposed on through electrodes 14 exposed to opening parts 35 formed in a resin layer 25 while the resin layer 28, the wiring patterns 26, 29 and the solder resist 32 are excluded from the components of the substrate 10 with the through electrodes of the first embodiment.

The substrate 60 with the through electrodes of the second embodiment constructed as described above can be manufactured by forming the diffusion preventive film 33 on upper surfaces 14A of the through electrodes 14 after the step shown in FIG. 23 described in the first embodiment and then removing a support plate 45 and a seed layer 46.

A manufacturing method of the substrate with the through electrodes of the embodiment can obtain an effect similar to that of the manufacturing method of the substrate 10 with the through electrodes of the first embodiment.

Third Embodiment

Figure 31:
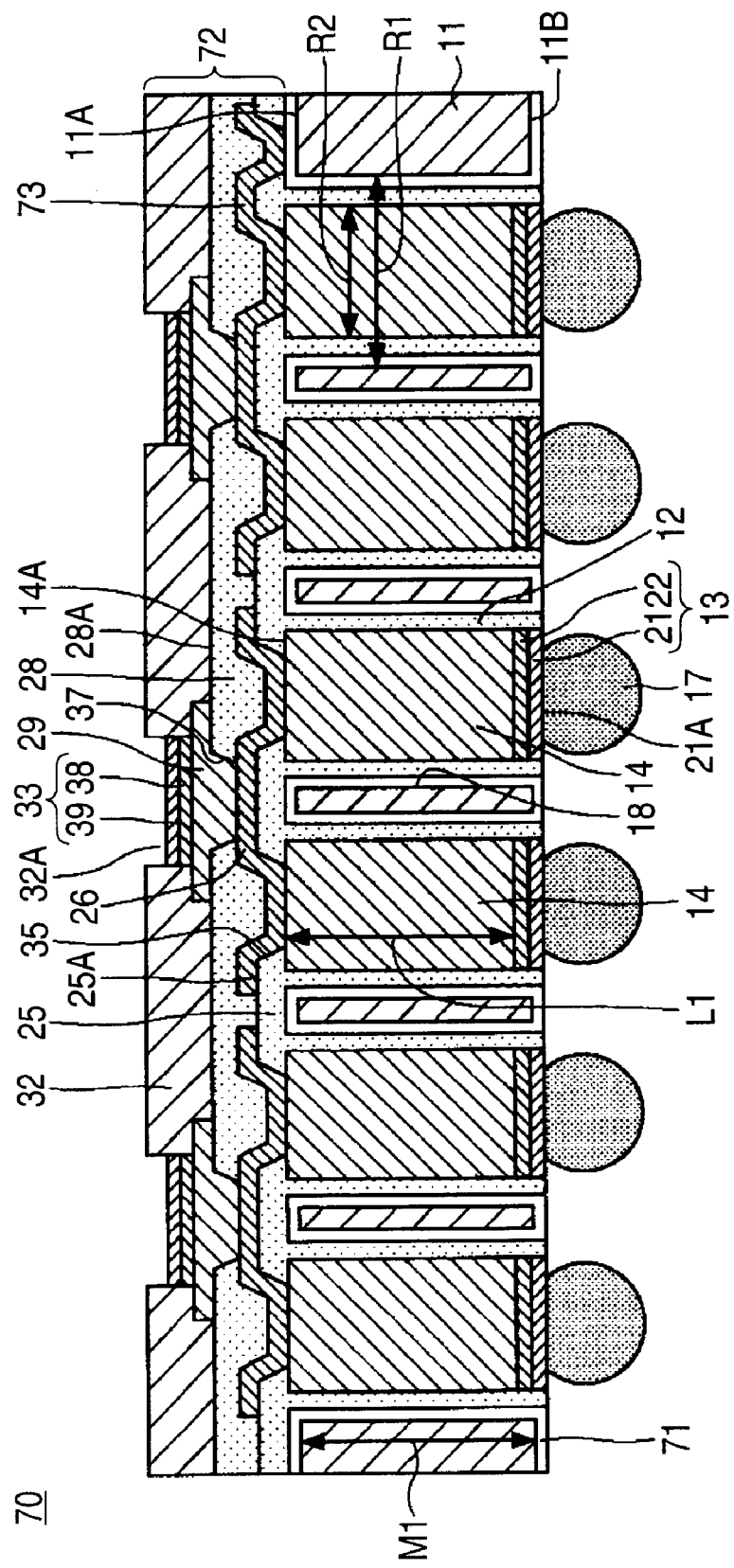
FIG. 31 is a sectional diagram of a substrate with through electrodes according to a third embodiment of the invention.

FIG. 31 is a sectional diagram of a substrate with through electrodes according to a third embodiment of the invention. In FIG. 31, the same numerals are assigned to the same components as those of the substrate 10 with the through electrodes of the first embodiment.

Referring to FIG. 31, a substrate 70 with through electrodes of the third embodiment is constructed in a manner similar to the substrate 10 with the through electrodes except that a conductor layer 71 is further disposed while disposing a build-up structural body 72 instead of the build-up structural body 16 disposed in the substrate 10 with the through electrodes of the first embodiment.

The conductor layer 71 is disposed so as to cover inner walls of through holes 18 and an upper surface 11A and a lower surface 11B of a substrate 11. By disposing the conductor layer 71 on the inner walls of the through holes 18, through electrodes 14 can be formed in a coaxial structure. The conductor layer 71 is a layer acting as a power source potential or a ground potential by being connected to a wiring pattern 73 described below. The conductor layer 71 can be constructed by, for example, a Cu plated film formed by an electroless plating method and a Cu plated film formed by an electrolytic plating method.

The build-up structural body 72 is disposed on the substrate 11 in which the conductor layer 71 is formed. The build-up structural body 72 has construction similar to the build-up structural body 16 except that the wiring pattern 73 is further disposed in the construction of the build-up structural body 16 described in the first embodiment. The wiring pattern 73 is disposed on the conductor layer 71 formed on the upper surface 11A of the substrate 11 and opening parts 35 so as to electrically connect the two adjacent through electrodes 14 to the conductor layer 71 as one example. As a material of the wiring pattern 73, for example, Cu can be used.

The substrate 70 with the through electrodes of the third embodiment constructed as described above can be manufactured by a technique similar to that of the substrate 10 with the through electrodes of the first embodiment, and can obtain an effect similar to that of the manufacturing method of the substrate 10 with the through electrodes of the first embodiment.

The invention can be applied to a manufacturing method of a substrate with a through electrode comprising a through electrode extending through a substrate.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A manufacturing method of a substrate with a through electrode, comprising:
   a through electrode formation step of forming a diffusion preventive film on a support plate and then forming a through electrode on a first surface of the diffusion preventive film;
   a substrate formation step of forming a substrate having a through hole;
   after the through electrode formation step and the substrate formation step, a through electrode reception step of stacking the substrate on the support plate and receiving the through electrode in the through hole such that a first surface of the substrate is flush with a second surface of the diffusion preventive film opposite to the first surface of the diffusion preventive film;
   after the through electrode reception step, a resin filling step of filling a gap between a side surface of the through electrode and an inner wall of the through hole of the substrate with a resin;
   a support plate removal step of removing the support plate after the resin filling step to expose the flush first surface of the substrate and the second surface of the diffusion preventive film; and
   a wiring layer formation step of forming a wiring layer, which is electrically connected to the through electrode, on a second surface of the substrate opposite to the first surface of the substrate, between the resin filling step and the support plate removal step.

2. The manufacturing method of a substrate with a through electrode as claimed in claim 1, wherein in the through electrode formation step, the through electrode is formed by electrolytic plating.

3. The manufacturing method of a substrate with a through electrode as claimed in claim 1, wherein the through electrode formation step includes forming the diffusion preventive film and the through electrode to have an equal and uniform diameter.

4. The manufacturing method of a substrate with a through electrode as claimed in claim 1, wherein the substrate formation step includes forming the substrate to have a height substantially equal to a summed height of the through electrode and diffusion preventive film,
   said height of the substrate being a distance between the first surface of the substrate and a second surface of the substrate opposite to the first surface of the substrate, and said summed height of the through electrode and diffusion preventive film being a distance between the second surface of the diffusion preventive film and a distal surface of the through electrode spaced from and opposed to the first surface of the diffusion preventive film.

5. The manufacturing method of a substrate with a through electrode as claimed in claim 4, wherein the through electrode reception step further includes stacking the substrate on the support plate and receiving the through electrode in the through hole such that the distal surface of the through electrode is flush with the second surface of the substrate.

6. The manufacturing method of a substrate with a through electrode as claimed in claim 1, further comprising a fixing step, between the through electrode formation step and the resin filling step, of holding the substrate such that a position of the substrate relative to the through electrode and support plate is not displaced.

7. The manufacturing method of a substrate with a through electrode as claimed in claim 1, wherein the resin filling step further includes covering a substrate second surface with the resin, the substrate second surface being opposite to the substrate first surface.

8. A manufacturing method of a substrate with a through electrode, comprising:
   a through electrode formation step of forming a diffusion preventive film on a support plate and then forming a through electrode on a first surface of the diffusion preventive film;
   a substrate formation step of forming a substrate having a through hole;
   after the through electrode formation step and the substrate formation step, a through electrode reception step of stacking the substrate on the support plate and receiving the through electrode in the through hole such that a first surface of the substrate is flush with a second surface of the diffusion preventive film opposite to the first surface of the diffusion preventive film;
   after the through electrode reception step, a resin filling step of filling a gap between a side surface of the through electrode and an inner wall of the through hole of the substrate with a resin; and
   a support plate removal step of removing the support plate after the resin filling step to expose the flush first surface of the substrate and the second surface of the diffusion preventive film,
   wherein the through electrode reception step includes receiving the through electrode in the through hole such that the side surface of the through electrode is spaced from the inner wall of the through hole, and the resin filling step includes filling the gap between the inner wall of the through hole and the side surface of the through electrode such that a surface formed by the resin is flush with the first surface of the substrate and the second surface of the diffusion preventive film.

9. The manufacturing method of a substrate with a through electrode as claimed in claim 8, wherein the substrate formation step includes forming the through hole to have a diameter greater than a diameter of the through electrode and the diffusion preventive film.

10. The manufacturing method of a substrate with a through electrode as claimed in claim 8, wherein the support plate removal step further includes removing the support plate to expose the flush first surface of the substrate, second surface of the diffusion preventive film, and surface of the resin.

11. The manufacturing method of a substrate with a through electrode as claimed in claim 8, wherein in the through electrode formation step, the through electrode is formed by electrolytic plating.

12. The manufacturing method of a substrate with a through electrode as claimed in claim 8, wherein the through electrode formation step includes forming the diffusion preventive film and the through electrode to have an equal and uniform diameter.

13. The manufacturing method of a substrate with a through electrode as claimed in claim 8, wherein the substrate formation step includes forming the substrate to have a height substantially equal to a summed height of the through electrode and diffusion preventive film, said height of the substrate being a distance between the first surface of the substrate and a second surface of the substrate opposite to the first surface of the substrate, and said summed height of the through electrode and diffusion preventive film being a distance between the second surface of the diffusion preventive film and a distal surface of the through electrode spaced from and opposed to the first surface of the diffusion preventive film.

14. The manufacturing method of a substrate with a through electrode as claimed in claim 13, wherein the through electrode reception step further includes stacking the substrate on the support plate and receiving the through electrode in the through hole such that the distal surface of the through electrode is flush with the second surface of the substrate.

15. The manufacturing method of a substrate with a through electrode as claimed in claim 8, further comprising a fixing step, between the through electrode formation step and the resin filling step, of holding the substrate such that a position of the substrate relative to the through electrode and support plate is not displaced.

16. The manufacturing method of a substrate with a through electrode as claimed in claim 8, wherein the resin filling step further includes covering a substrate second surface with the resin, the substrate second surface being opposite to the substrate first surface.

17. The manufacturing method of a substrate with a through electrode as claimed in claim 8, further comprising:

a wiring layer formation step of forming a wiring layer, which is electrically connected to the through electrode, on a second surface of the substrate opposite to the first surface of the substrate, between the resin filling step and the support plate removal step.

\* \* \* \* \*